(12) United States Patent
Smith et al.

(10) Patent No.: US 9,726,733 B2
(45) Date of Patent: Aug. 8, 2017

(54) OPTICAL MAGNETOMETERS

(71) Applicant: Geometrics. Inc., San Jose, CA (US)

(72) Inventors: Kenneth R. Smith, Fremont, CA (US); Krzysztof Kiersnowski, Orinda, CA (US)

(73) Assignee: Geometrics, Inc., San Jose, CA (US)

( * ) Notice: Subject to any disclaimer, the term of this patent is extended or adjusted under 35 U.S.C. 154(b) by 99 days.

(21) Appl. No.: 14/604,164

(22) Filed: Jan. 23, 2015

(65) Prior Publication Data
US 2015/0130456 A1    May 14, 2015

Related U.S. Application Data

(63) Continuation-in-part of application No. 13/773,280, filed on Feb. 21, 2013.

(60) Provisional application No. 61/601,883, filed on Feb. 22, 2012, provisional application No. 61/930,777, filed on Jan. 23, 2014.

(51) Int. Cl.
*G01R 33/26* (2006.01)

(52) U.S. Cl.
CPC .................. *G01R 33/26* (2013.01)

(58) Field of Classification Search
CPC ..... G01R 33/032; G01R 33/26; G01N 24/006
See application file for complete search history.

(56) References Cited

U.S. PATENT DOCUMENTS

| | | |
|---|---|---|
| 3,150,313 A | 9/1964 | Hans |
| 3,257,608 A | 6/1966 | Bell et al. |
| 3,641,426 A | 2/1972 | Brun et al. |
| 3,652,926 A | 3/1972 | Brun |
| 4,587,487 A | 5/1986 | Zanzucchi |
| 5,225,778 A | 7/1993 | Chaillout et al. |
| 5,266,896 A | 11/1993 | Rugar et al. |
| 6,888,780 B2 | 5/2005 | Happer et al. |
| 6,919,770 B2 | 7/2005 | Happer et al. |
| 7,102,451 B2 | 9/2006 | Happer et al. |
| 7,145,333 B2 | 12/2006 | Romalis et al. |
| 7,323,941 B1 | 1/2008 | Happer et al. |
| 7,652,473 B2 | 1/2010 | Kawabata |
| 7,723,985 B2 | 5/2010 | Smith |
| 7,872,473 B2 | 1/2011 | Kitching et al. |

(Continued)

OTHER PUBLICATIONS

Aleksandrov, E.B., et al., "A Noise-Immune Cesium Magnetometer," Instruments and Experimental Techniques, vol. 50, No. 1, pp. 91-94, 2007.

(Continued)

*Primary Examiner* — Melissa Koval
*Assistant Examiner* — Rishi Patel
(74) *Attorney, Agent, or Firm* — PatentBest; Andrew McAleavey (57) ABSTRACT

An optical magnetometer is disclosed. The device includes a cell filled with a substance that has a magnetic moment, such as an alkali metal. First and second light sources, typically diode lasers, illuminate the cell, one optically pumping the cell and one probing the cell. The two diode lasers are set to emit light at two distinct wavelengths, one set to drive a first transition and the other set to drive a second transition within the substance filling the cell. The probe laser light transiting the cell is used to modulate the frequency of the probe laser. The two beams of light are polarized with an ellipticity of at least 0.3.

17 Claims, 8 Drawing Sheets

(56) References Cited

U.S. PATENT DOCUMENTS

| | | | |
|---|---|---|---|
| 8,054,074 B2 | 11/2011 | Ichihara et al. | |
| 8,212,556 B1 * | 7/2012 | Schwindt ............... | G01R 33/26 |
| | | | 324/304 |
| 8,836,327 B2 | 9/2014 | French et al. | |
| 2002/0051279 A1 | 5/2002 | Minemoto et al. | |
| 2008/0290867 A1 | 11/2008 | Smith | |
| 2011/0025323 A1 | 2/2011 | Budker et al. | |
| 2011/0031969 A1 | 2/2011 | Kitching et al. | |
| 2013/0147472 A1 | 6/2013 | French et al. | |

OTHER PUBLICATIONS

Alexandrov, E.B., et al., "Experimental Demonstration of the Sensitivity of an Optically Pumped Quantum Magnetometer," Technical Physics, vol. 49, No. 6, pp. 779-783, 2004.
Arnold L. Bloom, "Principles of Operation of the Rubidium Vapor Magnetometer," Applied Optics, vol. 1 No. 1, Jan. 1962, pp. 61-68.
Bell, William E. and Bloom, Arnold L., "Optical Detection of Magnetic Resonance in Alkali Metal Vapor," Physical Review, vol. 107, No. 4, Sep. 15, 1957.
Bell, William E. and Bloom, Arnold, L., "Optically Driven Spin Precession," Physical Review Letters, vol. 6, No. 6, Mar. 15, 1961.
Bick, M. et al., "SQUID Gradiometry for Magnetocardiography Using Different Noise Cancellation Techniques," IEEE Trans. on Applied Superconductivity, vol. 11, No. 1, Mar. 2001.
Budker, Dmitry and Romalis, Michael, "Optical Magnetometry," Nature Physics vol. 3, Apr. 2007.
Geometrics, Inc., "Final Report: A Miniature Wide Band Atomic Magnetometer." Department of Defense Strategic Environmental Research and Development Program (SERDP) Project MR-1512, Mar. 2011.
Geometrics, Inc., "Final Report: Development of a Micro-Fabricated Total-Field Magnetometer." Department of Defense Strategic Environmental Research and Development Program (SERDP) Project MR-1512, Mar. 2011.
Higbie et al., "Robust, High-speed, All-optical Atomic Magnetometer," Review of Scientific Instruments, vol. 77, 113106, 2006, 8 pages.
Hovde et al., "Sensitive Optical Atomic Magnetometer Based on Nonlinear Magneto-optical Rotation," Proc. SPIE 7693, Unattended Ground, Sea, and Air Sensor Technologies and Applications XII, 769313 May 7, 2010, 10 pages.
International Search Report and Written Opinion dated Jul. 25, 2013 from International Application No. PCT/US2013/027145.
Jiménez-Martínez et al., "Sensitivity Comparison of Mx and Frequency-Modulated Bell-Bloom Cs Magnetometers in a Microfabricated Cell," IEEE Trans. on Instrumentation and Measurement, vol. 59, No. 2, Feb. 2010.
Kawabata, R., et al., "Improvement of an Optically Pumped Magnetometer," Japanese Journal of Applied Physics, vol. 51, 2012.
Vasilakis et al., "Precision Measurement of Spin Interactions with High Density Atomic Vapors," in a Dissertation Presented to the Faculty of Princeton University in Candidacy for the Degree of Doctor of Philosophy, Sep. 2011, Chapters 5 and 7, 58 pages.
Weis, A. and Wynands, R., "Laser-Based Precision Magnetometry in Fundamental and Applied Research," Optics and Lasers in Engineering, vol. 43, pp. 387-401, 2005 (available online Jul. 27, 2004).
Belfi, J. et al., "Dual Channel Self-Oscillating Optical Magnetometer," Optical Society of America B, vol. 26, No. 5, May 1, 2009.
Kimball, D., et al., "Magnetometric Sensitivity Optimization for Nonlinear Optical Rotation with Frequency-Modulated Light: Rubidium D2 Line," J. Applied Physics, vol. 106, No. 6, Sep. 24, 2009.
Pustelny, S., et al., "Pump-Probe Nonlinear Magneto-Optical Rotation with Frequency Modulated Light," Arxiv.org Cornell University Library, Nov. 14, 2005.
Belfi, J. et al., "Dual Channel Self-Oscillating Optical Magnetometer," J. Optical Society of America B, vol. 26, No. 5, May 1, 2009.
Pustelny, S., et al., "Pump-Probe Nonlinear Magneto-Optical Rotation with Frequency Modulated Light," Arxiv.org, Cornell University Library, Nov. 14, 2005.

* cited by examiner

OPTICAL MAGNETOMETERS

CROSS-REFERENCE TO RELATED APPLICATIONS

This application is a continuation-in-part of U.S. application Ser. No. 13/773,280, filed Apr. 20, 2013, which claims priority to U.S. Provisional Patent Application No. 61/601,883, filed Feb. 22, 2012. This application also claims priority to U.S. Provisional Application No. 61/930,777, filed Jan. 23, 2014.

BACKGROUND OF THE INVENTION

1. Field of the Invention

The invention relates to magnetometers, devices for measuring magnetic fields, and more particularly to optical magnetometers.

2. Description of Related Art

A magnetometer is an instrument designed to measure the magnetic field within a measurement volume. In 1832, Carl Friedrich Gauss invented the first of these instruments by suspending a bar magnet in air using a thin wire. As magnetometers have developed, they've seen a number of uses, including calibrating magnets and measuring the magnetization of an object, but one of their most valuable commercial uses lies in the measurement of the magnetic field of the Earth itself. Local changes or disturbances in the Earth's magnetic field can indicate buried deposits of commercially valuable metals or metal ores, making magnetometers extremely useful for mining exploration and for geological applications in general. Some magnetometers also find military applications in the detection of submarines and other submerged vessels and objects.

One of the more common types of magnetometer takes advantage of the behavior of atoms and their constituent subatomic particles when subjected to magnetic fields. Most atoms and subatomic particles have natural magnetic moments arising from a property called the "spin" of the particle. If an atom is subjected to a magnetic field whose direction is not aligned with the axis of its magnetic moment, it will wobble or precess at a frequency known as the Larmor frequency, much as a spinning top wobbles relative to vertical (i.e., relative to gravity) when its spin is disturbed by an outside force. In the late 1950s and early 1960s, it was determined that very sensitive measurements of a magnetic field could be made by measuring and tracking the Larmor frequency of alkali metal atoms in vapor form that were placed in the magnetic field. In this type of magnetometer, called a Bell-Bloom magnetometer after its inventors, beams of light are used to place the atoms in a suitable state for measurement and to read the Larmor frequency.

The first Bell-Bloom magnetometer was described in U.S. Pat. No. 3,257,608, which is incorporated by reference in its entirety. In practice, an alkali metal (rubidium in the earliest Bell-Bloom magnetometers, cesium in most modern implementations) is placed in a closed glass cell, usually along with a buffer gas like nitrogen. The cell is heated to maintain a certain vapor pressure of the alkali metal. Light is then introduced into the cell to illuminate the alkali vapor.

The electrons in any particular atom can occupy a number of distinct energy states or levels that are dictated by the principles of quantum mechanics. However, only in certain energy levels will the electrons interact with the light of a particular wavelength. Thus, light at specific wavelengths introduced into the cell is used to place the atoms in a predictable quantum state in a process called optical pumping. If a typical atom in one of its ground (i.e., unexcited) states is hit with a photon of light, it will absorb energy from the photon, transition to a higher energy level, and then decay to some other ground state, releasing a photon in the process. As a result of optical pumping, the electrons preferentially occupy energy levels that do not interact with the incoming photons of light. Thus, the photons can pass through the vapor unimpeded and the atomic vapor is said to be polarized.

Once the vapor has measureable polarization, the measurement of the magnetic field using the same or another light source can take place. As was described above, Bell-Bloom magnetometers measure a magnetic field by measuring the Larmor frequency of the precessing atoms and by tracking changes in that frequency due to changes in the magnetic field. In practice, that is done by quickly switching the light source between two optical wavelengths, one of which is resonant with an optical absorption line and the other of which is not, at a rate equal to the Larmor frequency. When the optically-pumped atoms in the cell are exposed to light being switched at the Larmor frequency as described above, magnetic resonance occurs. The vapor in this case is maximally polarized and the light absorption by the cell reaches a detectable minimum, meaning that more light is transmitted through the cell. Switching the optical frequency at any other frequency, however, does not create a magnetic resonance. Thus, the minimum absorption point, indicative of the Larmor frequency, can be tracked.

The light that is not absorbed by the cell passes through it and strikes a photodetector. The output from the photodetector, after passing through a number of filters and amplifiers, is used both to determine and track the Larmor frequency and as an input to the light source to modulate it in the Bell-Bloom configuration. Alternatively, as was described briefly above, the output from the photodetector may also be used to drive an inductor coil that applies a magnetic field to the cell in the so-called Mx or Mz configurations. Either the modulated light or the applied magnetic field keeps the atoms precessing within the cell.

There are a number of areas where the performance of the typical Bell-Bloom magnetometer can be improved. For example, atoms occupying different ground states precess at slightly different Larmor frequencies. Thus, the detected magnetic resonance is not actually a resonance, but rather a group of resonances that are wider than their spacing, each with its own Larmor frequency. That is, the measured Larmor frequency is a composite of the Larmor frequencies of the group of atomic ground states. When the light source is switched or modulated at the composite Larmor frequency, the detected composite magnetic resonance may momentarily have specific magnetic resonances enhanced, thus altering the populations of those energy states and affecting the Larmor frequency itself. This can lead to measurement errors.

Figure 1:
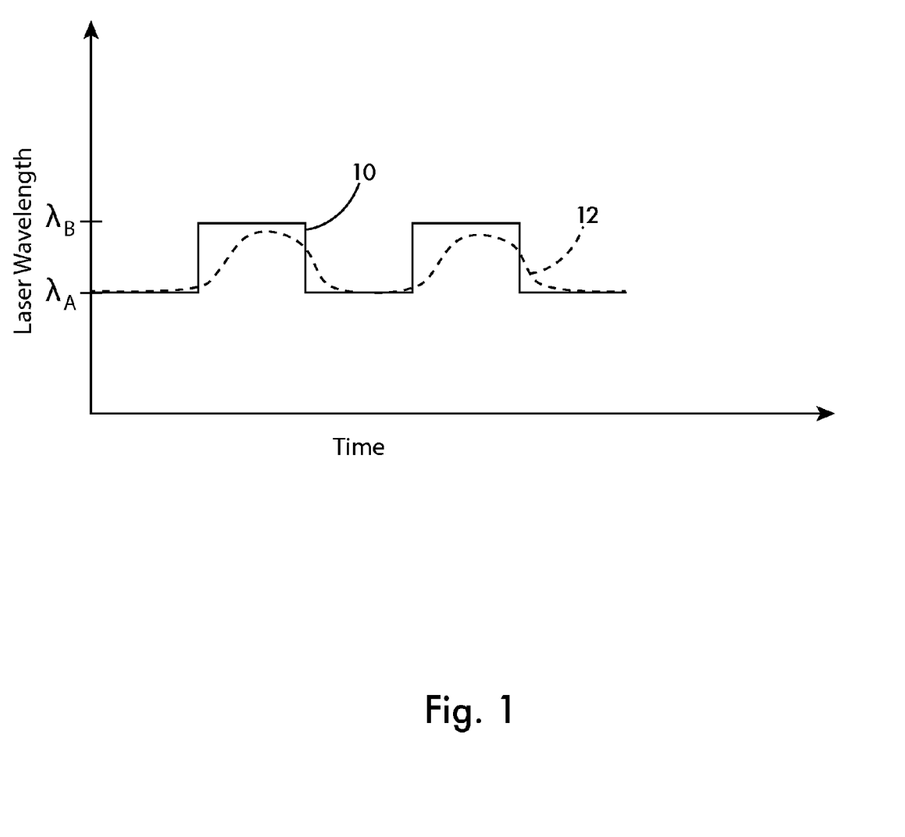
FIG. 1 is an illustration of light source input and output (i.e., response) characteristics in a prior art method of modulating a light source.

Additionally, the way in which the light source is modulated or driven can reduce sensitivity or contribute to error. Simply put, no light source will respond immediately or perfectly to a change in input. FIG. 1, a schematic diagram of input and output waveforms, illustrates this phenomenon. If the input to a light source such as a laser is a square wave 10 that alternates between wavelengths $\lambda_A$ and $\lambda_B$, the actual response (i.e., output) of the laser may be a waveform like waveform 12, which has a lower, rounded amplitude overall and may be significantly phase-shifted (i.e., delayed) compared with the input square wave 10.

SUMMARY OF THE INVENTION

One aspect of the invention relates to a magnetometer. The magnetometer comprises a spin ensemble—a cell filled with a material that has a magnetic moment, such as a cesium vapor, and a measurable resonance frequency. A first pump laser diode illuminates the cell and emits light at a particular wavelength to optically pump the material in the cell. A second probe laser diode illuminates the cell and emits a light at a particular wavelength to probe the cell. The light from the probe laser diode is received by a photodetector and used for measurement. A controller also receives the signal from the photodetector and drives a self-oscillating circuit, using the signal from the photodetector in a positive feedback loop to modulate the wavelength of the pump laser diode in order to maintain the material in the cell precessing at the Larmor resonance frequency. One laser diode is set to a wavelength that will excite and drive a first transition within the spin ensemble, and the other laser diode is set to a wavelength that will excite and drive a second transition within the spin ensemble. The light from the pump and probe laser diodes may be polarized with an ellipticity of at least 0.3.

Another aspect of the invention relates to a method of pumping and probing a spin ensemble in a quantum mechanical measurement device. The method comprises setting a pump laser diode to emit at a wavelength sufficient to drive a first transition within the spin ensemble, and setting a probe laser diode to emit at a wavelength sufficient to drive a second transition within the spin ensemble. Both laser beams are polarized with an ellipticity of at least 0.3. The quantum mechanical measurement may be a measurement of a magnetic field.

These and other aspects, features, and advantages of the invention will be set forth in the description that follows.

BRIEF DESCRIPTION OF THE DRAWING FIGURES

The invention will be described with respect to the following drawing figures, in which like numerals represent like views throughout the figures, and in which.

DETAILED DESCRIPTION

Figure 2:
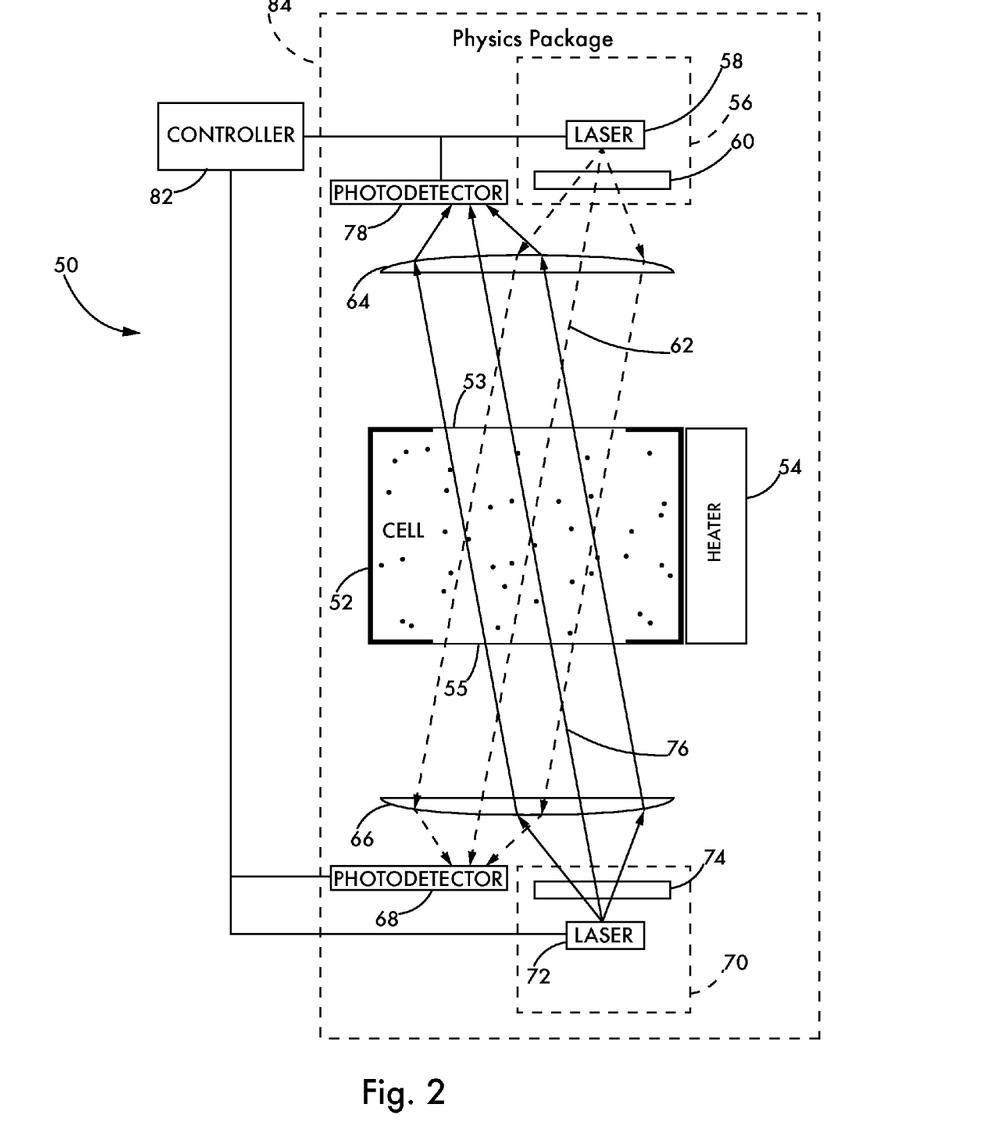
FIG. 2 is a schematic diagram of some the components of a magnetometer according to one embodiment of the invention.

FIG. 2 is a schematic view of a magnetometer, generally indicated at 50, according to one embodiment of the invention. The magnetometer 50 includes a cell 52, typically made of glass. The cell 52 is typically filled with an alkali metal, such as rubidium, cesium, or potassium, and may also include a buffer gas, such as nitrogen. A heater 54, typically using a resistive heating element, is provided to maintain the alkali metal (or at least a sufficient portion of it) in the vapor state. In some cases, the interior walls of the cell 52 may be surface modified or coated to prevent particles that collide with the sidewalls of the cell 52 from randomizing the distribution of atomic populations in the ground energy state.

While portions of this description may refer to a cell 52 that contains an alkali metal vapor, cells 52 in embodiments of this invention may be filled with other things. More generally, any particles or entities that possess the property of magnetic moment, that will precess in a magnetic field, and that will interact with light for optical pumping and measurement purposes may be used in various embodiments of the invention. Examples include various other kinds of atomic and molecular vapors, trapped electrons, trapped protons, and nitrogen vacancy centers. In portions of this description, the cell 52 containing light-responsive particles may be referred to as a "spin ensemble."

In general Bell-Bloom magnetometers, a single light source may be used both to pump and to probe the cell 52. However, the present inventors have found that in embodiments of the invention, it is helpful if two separate light sources are used, one to optically pump the vapor in the cell 52, and another light source to probe the vapor in the cell 52, primarily because doing so may simplify the electronics needed to control and take readings from the magnetometer 50. The light sources are most advantageously lasers, and more specifically diode lasers, such as Vertical Cavity Surface Emitting Lasers (VCSELs).

With respect to the schematic diagram of FIG. 2, a first light source 56 has a first laser diode 58 and a first polarizer 60. Light emitted by the laser diode 58 passes through the polarizer 60 and is thus polarized.

In embodiments of the invention, the light is most advantageously circularly polarized, but it need not be completely circularly polarized. Light that includes both circular and linear components is referred to as "elliptically polarized." The ellipticity of optical polarization is defined as the ratio of the optical power of the circularly polarized component divided by the total optical power. Thus, linearly polarized light has an ellipticity of 0, while perfectly circularly polarized light has an ellipticity of 1. Generally speaking, as the ellipticity of the laser beam increases from 0 to 1, the performance of the magnetometer 50 increases as well. While perfectly circularly polarized light may be ideal in some embodiments, the present inventors have found that an ellipticity of at least about 0.3 is sufficient to generate a reasonable magnetometer signal in at least some embodiments. Specific polarization schemes will be described in greater detail below. As those of skill in the art will realize, some light sources may inherently provide polarized light, making separate polarizers 60, 74 unnecessary.

Light from the first light source 56 passes through a first optical path 62, which includes a first lens 64. The light passes through the cell 52 and a second lens 66 before striking a first photodetector 68. While the lenses may or may not be used, it is advantageous to use a convex lens to collimate the divergent rays emitted by the laser and to focus them on the photodetector after having passed through the cell 52.

Similarly, a second light source 70 has a second laser diode 72 and a second polarizer 74. As will be described below in more detail, the second polarizer 74 may produce a different polarization than the first polarizer 74. Light from the second light source 70 follows a second optical path 76 and passes through the second lens 66, the cell 52, and the first lens 64 before striking a second photodetector 78.

Although the cell 52 of FIG. 2 may be fully transparent to light, it need not be. Rather, it is sufficient if there is a transparent optical path through the cell, with optical entrance and exit ports. Thus, for example, the cell 52 could be machined from silicon with glass ports or windows. Two ports 53, 55 are shown in FIG. 2.

The photodetectors 68, 78 of the illustrated embodiment would typically measure light intensity, and those measurements will be described below in more detail. However, in other embodiments, light detectors may detect any salient property of light, including polarization, wavelength, frequency, or any other property or combination of properties.

The above-described components are sometimes referred to as the "physics package" of the magnetometer 50. As shown in FIG. 2, a controller 82 is also provided to control the magnetometer 50. The controller 82 may include analog or digital electronics, or a combination of both and its components will be described in greater detail below. In most embodiments of the invention, the controller 82 implements feedback control algorithms to control the wavelengths of the diode lasers 58, 72 and, more importantly, to maintain the vapor in the cell 52 in a state of magnetic resonance.

While not shown in the view of FIG. 2, certain other components may be provided. For example, a driver or individual control element may be provided for each of the diode lasers 58, 72. As is known in the art, if the diode lasers 58, 72 are VCSELs, this driver or other individual control element may include a heater that controls the output light wavelength of the VCSEL 58, 72.

As those of skill in the art will realize, the magnetometer 50 is a tuned system, and elements that might either create interference or change the underlying frequencies would generally be controlled or engineered to ameliorate any deleterious effects. For example, the components of the physics package may be located in a single enclosure 84, with the controller 82 located separately. In that case, any cable connecting the controller 82 with the enclosure 84 should be of a known length, and that length should be taken into account.

Figure 3:
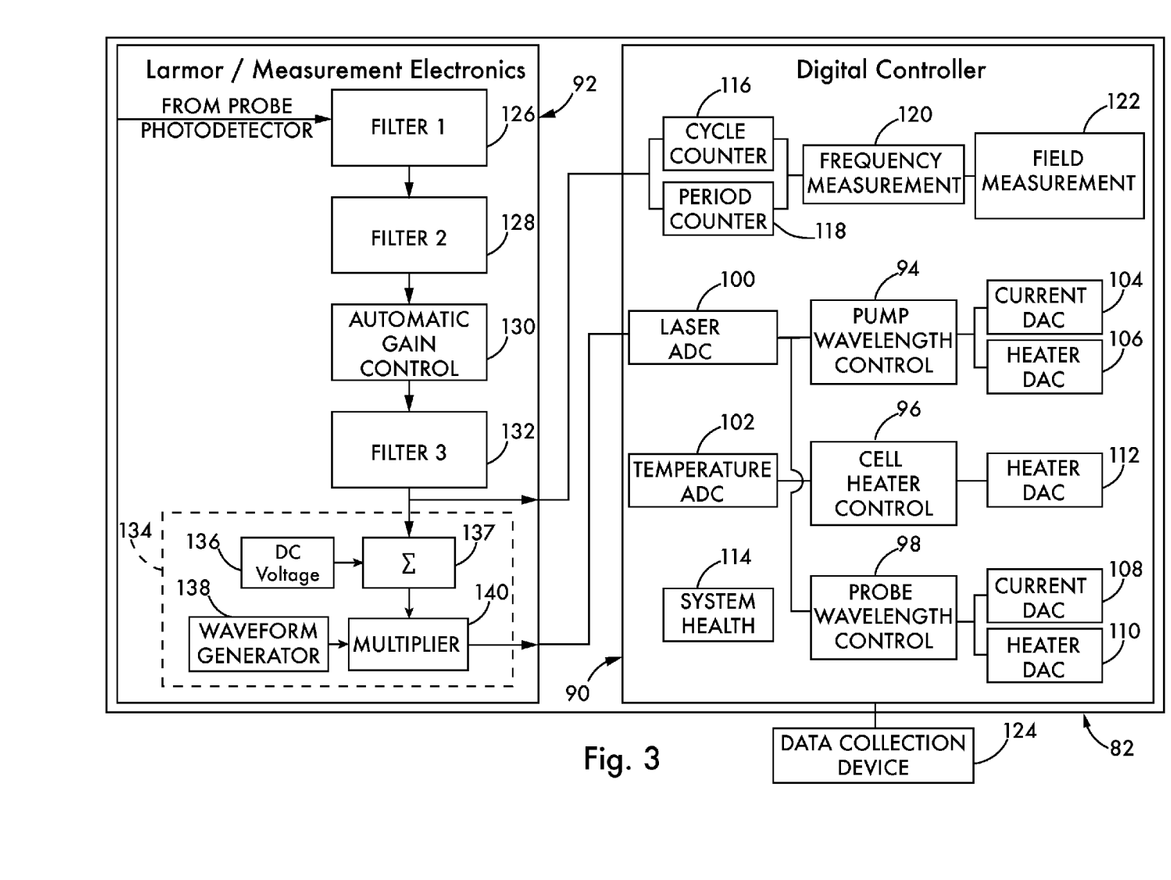
FIG. 3 is a schematic diagram of the components of the controller of the magnetometer of FIG. 2.

The controller 82 may be implemented using digital electronics, analog electronics, or some combination of the two. FIG. 3 is a schematic diagram of the controller 82. The controller 82 of the illustrated embodiment includes both digital control electronics 90 and analog Larmor electronics 92. Generally speaking, the digital control electronics 90 control general system functions, monitor system health, and handle the output of magnetic field strength readings. The Larmor electronics 92 control the output of the pump and probe diode lasers 58, 72 and implement a positive feedback loop to drive the pump diode laser and maintain atomic precession at the Larmor frequency.

More specifically, the digital control electronics 90 include a pump laser wavelength controller 94, a cell heater controller 96, and a probe laser wavelength controller 98. Each of these controllers 94, 96, 98 has one or more associated analog-to-digital converters (ADCs) and one or more associated digital-to-analog converters (DACs) in order to convert analog to digital signals, so that the digital control electronics 90 can communicate and cooperate with the analog Larmor electronics 92. These include a laser ADC 100 that converts the analog input from the lasers and a temperature ADC 102 that converts the analog input from a temperature measurement device, such as a thermistor, coupled to the cell 52. There are also current and heater DACs 104, 106 for the pump laser and current and heater DACs 108, 110 for the probe laser. Finally, a cell heater DAC 112 converts the digital cell heater control signals to analog.

The digital control electronics 90 also include a system health monitor 114 and the components that actually measure and output a magnetic field strength measurement. Specifically, a cycle counter 116 and period counter 118 output to frequency measurement electronics 120, the output from which is used by field measurement electronics 122 to produce a final magnetic field measurement.

The Larmor electronics 92 may take input from one or both of the photodetectors 68, 78, the output of which may first pass through a preamplifier before reaching the main Larmor electronics 92. Although FIG. 1 illustrates that there are two photodetectors 68, 78, one for each of the diode lasers 58, 72, the present inventors have found that for purposes of controlling the output of both of the diode lasers 58, 72, it is only necessary to use the output from the photodetector that receives light from the probe laser diode. The output of the other photodetector 68, 78 can be used for diagnostic or other application-specific purposes.

For purposes of the following description, it will be assumed that the magnetometer 50 of FIG. 1 is configured such that the first laser diode 58 is being used as the pump laser and the second laser diode 72 is being used as the probe laser, with its light being received by the second photodetector 78.

Light from the second photodetector 78 may be amplified by a preamplifier before the signal is processed by the main Larmor electronics 92. Generally speaking, the Larmor electronics 92 filter and amplify the signal before using it as input to a modulator that controls the pump laser frequency.

The precise characteristics of the filters, amplifiers, and modulator will depend on the nature of the spin ensemble and a number of other factors. In the illustrated embodiment of FIG. 3, the preamplified output from the second photodetector 78 is fed into a first filter 126 and then a second filter 128 before being input to an automatic gain controller 130 and a third filter 132. The three filters 126, 138, 132 filter different frequencies. As one example, if the vapor in the cell 52 is a cesium vapor, the first filter 126 may be a 400 kHz low pass filter, the second filter 128 may be a 30 kHz high pass filter, and the third filter 132 may be a 2.5 MHz low pass filter. As those of skill in the art will appreciate, the first and second filters 126, 128 may be replaced with a single band pass filter in some embodiments, and a third filter 132 may or may not be needed.

Once the signal has been filtered, it is sent to the counters 116, 118 of the digital control electronics 90. That same signal is also sent into a modulator 134, the output of which is sent to the pump laser frequency controller 94. In the illustrated embodiment, the modulator 134 includes a DC voltage generator 136. The output of the DC voltage generator 136 and the output of the third band pass filter 132 are sent to a summation circuit 137. A waveform generator 138 outputs a baseline sine wave. The signals from the waveform generator 138 and from the summation circuit 137 are sent to a multiplier 140, the output of which goes to the pump wavelength controller. To continue the example given above, working with a cesium vapor, the waveform generator 138 may generate an 11 MHz sine wave.

As shown in FIG. 3, the controller 82 may be connected to a data collection device 124, so that the field measurements and, in some cases, the frequency data on which they are based, are recorded. The data collection device may be a general-purpose computer or a specialized data acquisition system, and the data itself may be recorded on any convenient medium, be it paper or electronic. Suitable electronic media include hard disk drives, solid-state drives, FLASH memory, and optical media, like DVDs. The output of the controller 82 to the data collection device 124 may either be analog, digital, or a combination of both. The controller 82 may be provided with any number of connectors or input-output interfaces to interface with the data collection device 124 or devices.

The components illustrated in FIGS. 2 and 3 may be implemented at any scale. As those of skill in the art will appreciate, implementing the magnetometer 50 at micro-scale may be advantageous for a number of reasons. For example, with micro-scale components, less power is needed to heat the cell 52. Methods for constructing magnetometers at micro-scale are disclosed, for example, in Prouty, M., "Development of a Micro-Fabricated Total-Field Magnetometer," Final Report, SERDP Project MR-1512, March, 2011; and Prouty, M., "A Miniature Wide Band Atomic Magnetometer," Final Report, SERDP Project MR-1568, December, 2011, both of which are incorporated by reference in their entireties.

Methods of Operation

Figure 4:
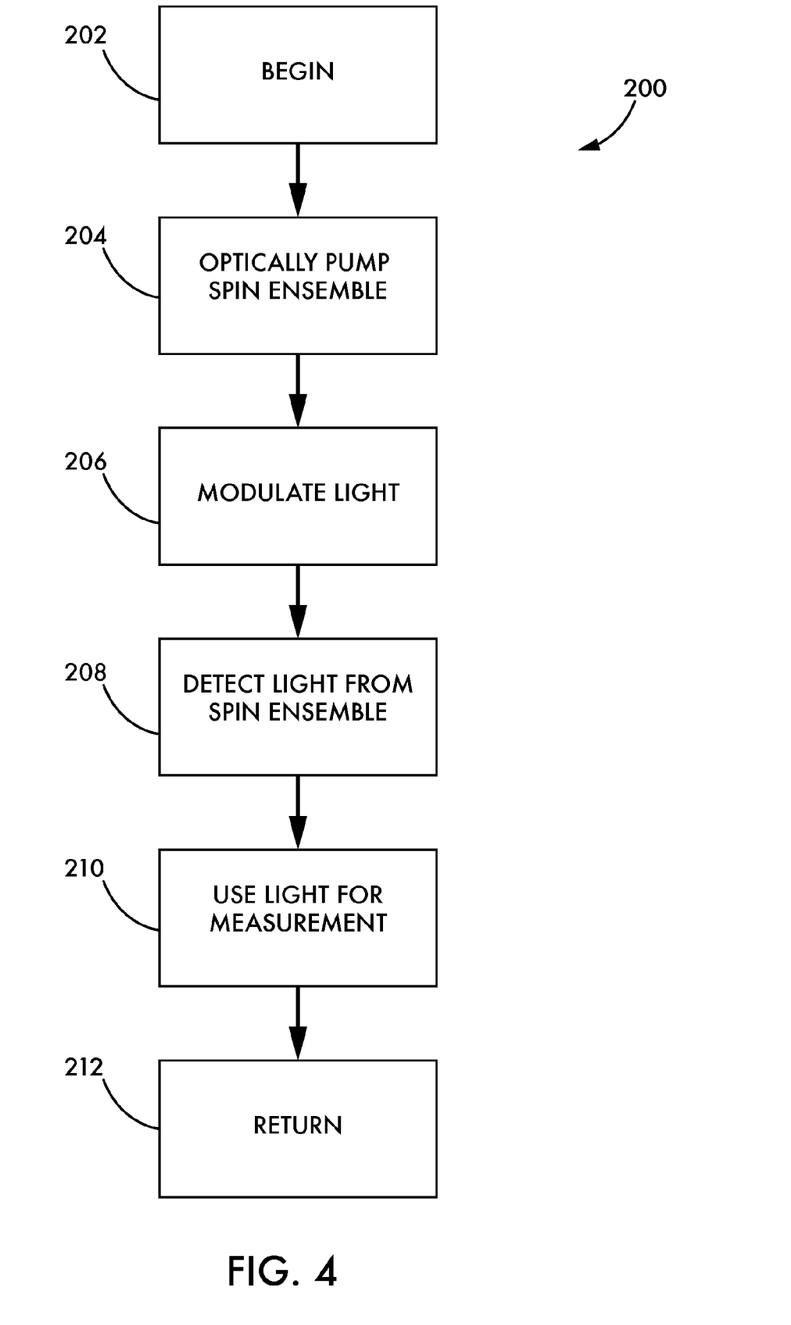
FIG. 4 is a flow diagram of a method for operating the magnetometer of FIG. 2.

FIG. 4 is a schematic illustration of a method, generally indicated at 200, for operating the magnetometer 50 and others according to embodiments of the invention. In method 200 of FIG. 4, tasks are shown as occurring sequentially. However, as those of skill in the art will appreciate, in an operational magnetometer, these tasks occur more or less simultaneously to maintain the magnetic resonance condition. Method 200 begins at task 202 and continues with task 204. In task 204, light is introduced into the cell to induce polarization. Following task 204, light is modulated, as shown in task 206.

As with the example above, in the description below, it will be assumed that the magnetometer 50 of FIG. 1 is configured such that the first laser diode 58 is being used as the pump laser and the second laser diode 72 is being used as the probe laser, with its light being received by the second photodetector 78. Furthermore, the first polarizer 60 circularly polarizes the light in a counter-clockwise direction along the light's direction of travel. The second polarizer 74 also circularly polarizes the light in a counter-clockwise direction along the light's direction of travel.

Other polarization schemes are possible, and other mechanisms may be used to separate and distinguish the two beams of light. The two beams may, for example, be polarized in the same direction, or may not be polarized at all. If polarization is not employed, the laser diodes 58, 72 may be focused to ensure that the light is separated when reaching the detectors. In one alternative embodiment, an opaque screen or an interferometric filter may be used to separate the pumping beam from the probing beam. As an alternative to that, separation of the two beams may be achieved by making the optical paths orthogonal.

Figure 5:
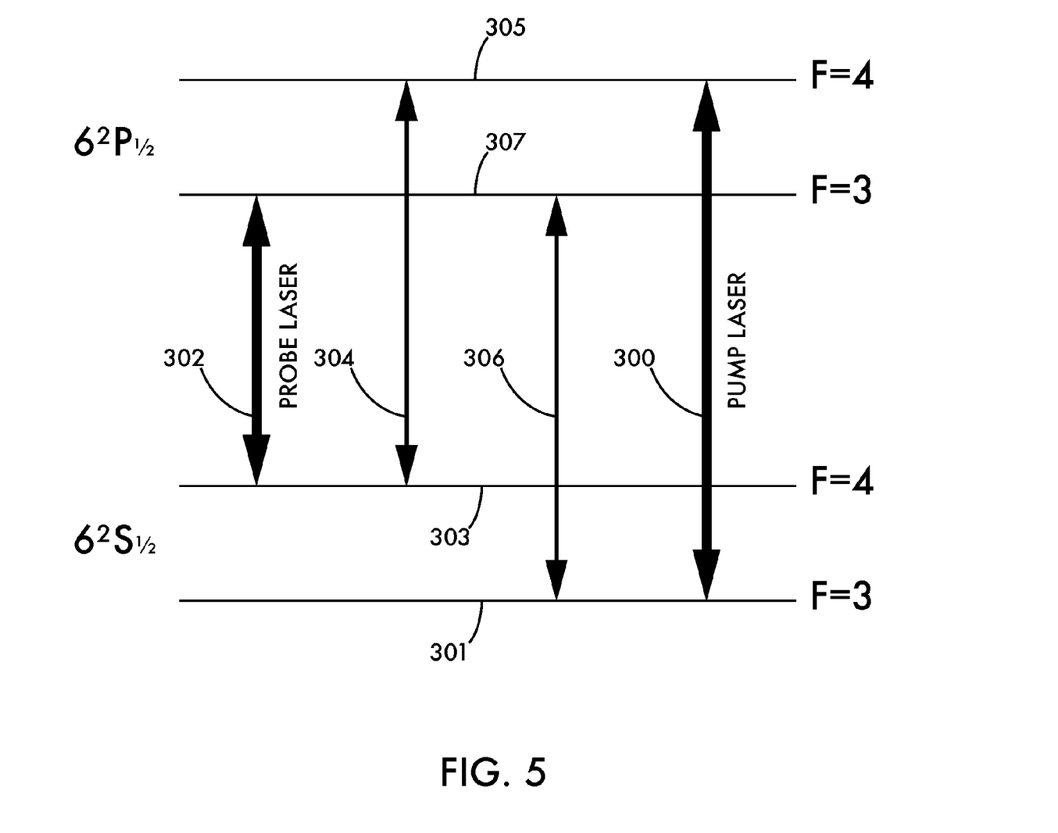
FIG. 5 is a diagram of an exemplary optical pumping and probing scheme for the magnetometer of FIG. 2.

FIG. 5 is a diagram of the pumping and probing scheme. For cesium vapor, the wavelength of the pump laser diode 58 is set to be resonant with and drive the transition from a first ground state 301, $6^2S_{1/2}$ F=3 to a first excited state 305, $6^2P_{1/2}$ F'=4 (transition 302 in FIG. 5). The wavelength of the probe laser diode 72 is set to be resonant with and drive the transition from a second ground state 303, $6^2S_{1/2}$ F=4, to a second excited state 307, $6^2P_{1/2}$ F'=3 (transition 300 in FIG. 5). Both transitions contribute to the cesium $D_1$ spectral line, however, that need not be the case in all embodiments. In other cases, the two transitions may contribute to different spectral lines.

This scheme has several advantages for the operation of the magnetometer 50. As was described broadly above, atoms will tend to occupy states that are not addressed by the lasers. When this occurs, the magnetometer signal is reduced. If only one of the two ground states 301, 303 is addressed, the other 301, 303, will become more populated, thus reducing the signal. By addressing both of these ground states, the effect is eliminated and the magnetometer signal is enhanced. The simplest way of addressing both the ground states is to operate two lasers, one at each wavelength resonant with a transition addressing a different ground state. Other transitions 304, 306 may occur.

As was described above, the pump laser frequency is traditionally rapidly switched at the Larmor frequency between a wavelength resonant with an optical transition and a non-resonant wavelength. In some cases, that may be done in embodiments of the present invention. However, the present inventors have found a more advantageous way to modulate the laser light.

Figure 6:
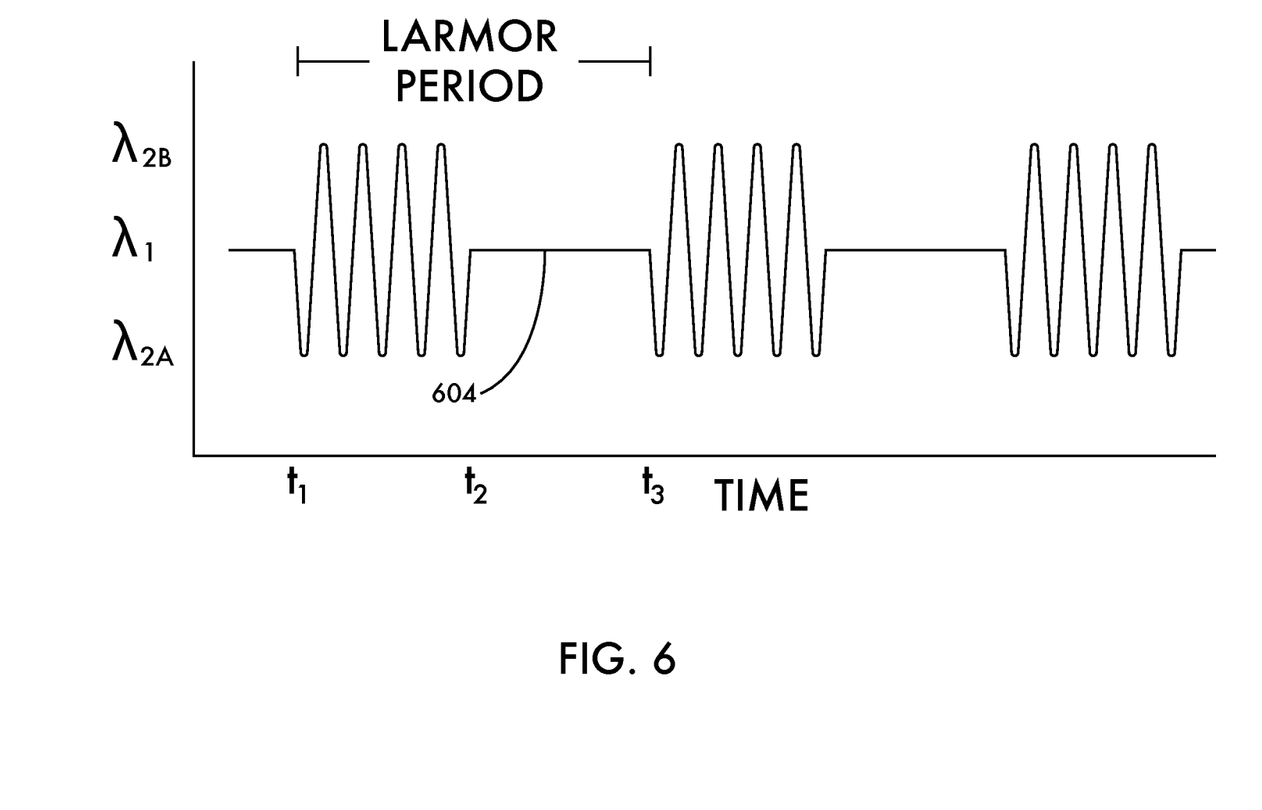
FIG. 6 is a waveform diagram illustrating the modulation of the pump laser in the magnetometer of FIG. 2.

FIG. 6 is a graph 604 of the modulating signal. In embodiments of the present invention, the pump laser wavelength is modulated or swept around the resonance wavelength of an optical transition of the spin ensemble. As will be evident from the graph 604 of the effect of the modulating signal, the modulating signal and its power spectrum are very different from the typical modulating signal shown in FIG. 1.

In the time domain, as can be seen from FIG. 6, at a time prior to time t1, the light is provided at a wavelength of $\lambda_1$. The wavelength $\lambda_1$ is at or near the center of the optical absorption line (FIG. 7; 606) corresponding to an optical transition, preferably between ground state 301, $6^2S_{1/2}$ F=3, and excited state 305, $6^2P_{1/2}$ F'=4. Then, from time $t_1$ to time $t_2$, the wavelength is rapidly modulated or swept between $\lambda_{2A}$ and $\lambda_{2B}$. In the illustrated embodiment, the waveform is sinusoidal between times $t_1$ and $t_2$, although other cyclical waveforms may be used. At time $t_2$, the frequency returns to $\lambda_1$ and remains at $\lambda_1$ until $t_3$, when the frequency is again modulated between $\lambda_{2A}$ and $\lambda_{2B}$. This repeats cyclically at a frequency at least approximately equal to the Larmor resonance frequency of the spin ensemble. Since frequency and period are inverses of one another, put another way, the time interval from $t_1$ to $t_3$ is equal to, or at least approximately equal to, the Larmor period of the spin ensemble.

As a result, and as can be seen from FIG. 6, for a portion of the Larmor period, the wavelength of the pump laser diode is resonant with the optical absorption line, while during another portion of the Larmor period, the wavelength of the pump laser diode is modulated around the optical absorption line. Although the modulating signal 604 has a square wave envelope in the illustrated embodiment, other embodiments may use a frequency modulation with a sine wave or another type of envelope. In this embodiment, $\lambda_{2A}$ and $\lambda_{2B}$ are wavelengths sufficiently spaced from $\lambda_1$ so that the optical absorption at those frequencies is less than 90% of the absorption at $\lambda_1$, i.e., there is more than a 10% reduction in absorption at $\lambda_{2A}$ and $\lambda_{2B}$ as compared with $\lambda_1$. The average wavelength of the light is at or near the resonant wavelength of the optical absorption line. Modulating or sweeping the wavelength of the laser light at a frequency more than three times faster than the precession resonance frequency forms frequency sidebands in the optical spectrum of the light, where the average frequency is in the middle of the frequency sidebands.

If one performs a Fourier Transform, such as a Fast Fourier Transform (FFT), on the modulating signal of FIG. 6, the power of the FFT in a band between one-third the spin precession resonance frequency and twice the spin precession resonance frequency is less than one-half of the total power in the FFT, not including DC.

Figure 7:
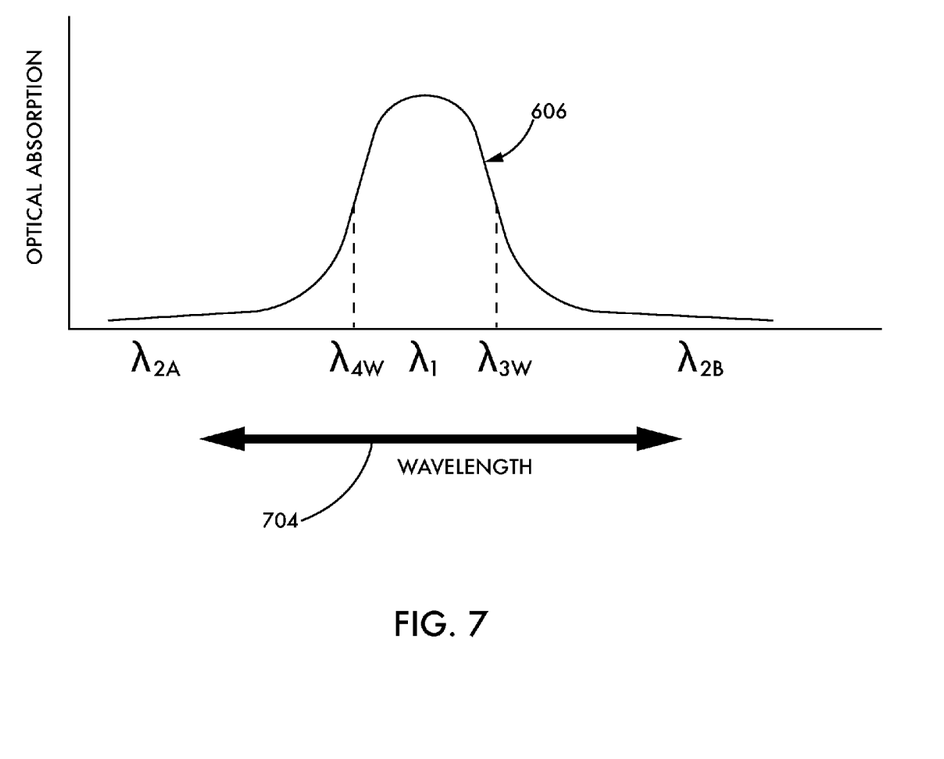
FIG. 7 is an illustration of an absorption curve of a spin ensemble with the modulation scheme of FIG. 6.

With respect to method 200 of FIG. 4, after the light is modulated in task 206, light passing through the spin ensemble is detected, as shown in task 208. FIG. 7 is an illustration of an exemplary light absorption curve 606, showing the light absorption of the cell versus the frequency of the light. The absorption curve 606 is simplified, showing the effect of only one transition for clarity. As shown in FIG. 7, the maximum absorption is at wavelength $\lambda_1$. As was described above, the wavelength of the light is modulated between $\lambda_1$ and $\lambda_{2A}$ and $\lambda_{2B}$. As shown by the light absorption curve 606 and arrow 704, $\lambda_{2A}$ and $\lambda_{2B}$ are wavelengths at which minimal light is absorbed by the spin ensemble. The modulation frequency is typically greater at than the rate at which the particles in the spin ensemble can respond to the light and less than the frequency of the next excited state transition. For cesium atoms, this typically means that the modulation frequency will be greater than about 1 MHz and less than about 100 MHz. While the illustrated embodiment uses wavelength modulation, other embodiments of the invention could use amplitude modulation instead. Moreover, in some embodiments, the two lasers could provide light of the same frequency.

The absorption curve 606 also has half amplitude width wavelengths $\lambda_{3W}$ and $\lambda_{4W}$, which are wavelengths at which the amplitude of absorption is half the amplitude of absorption at the resonance wavelength $\lambda_1$. When the average wavelength is at or near the resonance wavelength $\lambda_1$, then the average wavelength is between $\lambda_{3W}$ and $\lambda_{4W}$.

Once light is detected in task 208 of FIG. 4, method 200 continues with task 210, in which the light is used to make a quantum mechanical measurement, such as the strength or direction of a magnetic field. If the net polarization vector is parallel to the magnetic field, no precession signal will be measured. If the polarization vector (i.e., the magnetic moment) is not parallel to the magnetic field, a measurable precession will result. As was described above, and as can be seen from the absorption curve 606 of FIG. 7, as the particles precess in the magnetic field, they interact with the light beam, absorbing light. This produces an observable decline in brightness (i.e., an increase in absorbance) at the resonance wavelength $\lambda_1$. This modulation of the amplitude of the light received at the photodetector 78 has a characteristic frequency equal to the Larmor frequency. Methods of calculating the magnetic field from the measured Larmor frequency are well-known in the art.

Method 200 of FIG. 4 completes and returns at task 212, although it may be repeated many times. The spin ensemble is maintained in a ready-to-measure condition in part because the magnetometer 50 acts as a resonant circuit. Because the output of the second photodetector 78 is used to generate positive feedback that controls the pump laser diode 58, a self-oscillation is created at the Larmor frequency of the spin ensemble. In this sense, the term "self-oscillating feedback circuit" refers to the fact that the magnetometer 50 contains no variable frequency generating circuit to track the precession resonant frequency. In other words, no magnetic field is generated and applied to the spin ensemble. In order to obtain the positive feedback, the feedback signal must have a proper phase relationship with the atomic precession throughout the operating range of the magnetometer. Thus, the electronics should be engineered so that they do not alter the resonant frequency.

Because the magnetometer 50 of the illustrated embodiment provides optical light paths that are substantially parallel, it offers substantial advantages over prior art magnetometers, which may require a 90° phase shift, which limits magnetometer performance. Moreover, other prior art devices may experience a phase lag when moving a frequency off resonance, which may further limit performance.

Additional Embodiments

Figure 8:
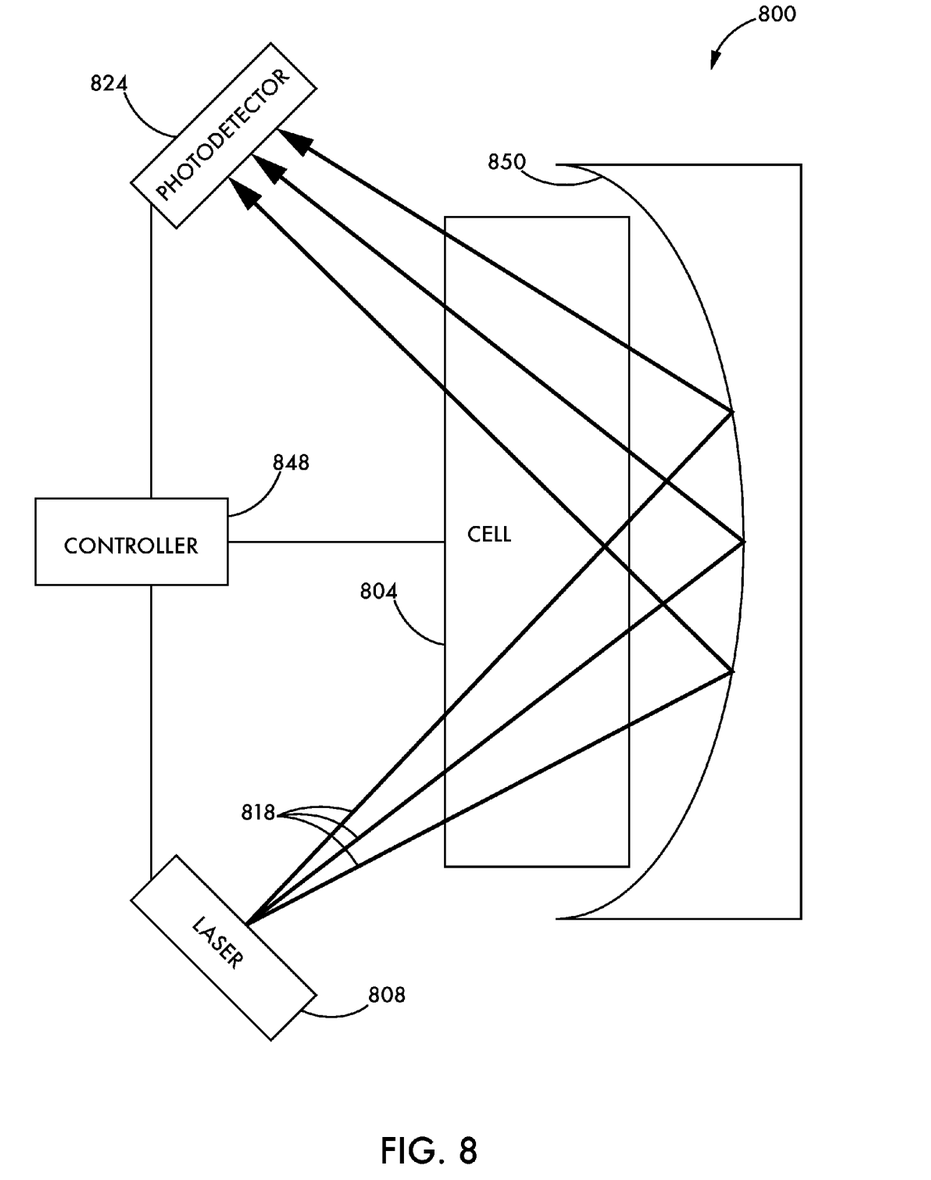
FIG. 8 is a schematic diagram of some of the components of a magnetometer according to another embodiment of the invention.

FIG. 8 is a schematic diagram of a magnetometer 800 according to another embodiment of the invention. Like in the magnetometer 50, a heated cell 804 contains an atomic or molecular vapor and acts as a spin ensemble. A single laser 808, such as a VCSEL laser diode, illuminates the cell 804. A concave focusing mirror 850 is located adjacent the cell, opposite the laser diode 808, and replaces the lenses 64, 66 used in magnetometer 50. A photodetector 824 is positioned adjacent the laser diode 808 to detect light, as will be described below, and a controller 848 is connected to the other components and is adapted to control the magnetometer 800. The functions of the components of magnetometer 800 are substantially similar to the functions of the components of magnetometer 50, except as described below.

In magnetometer 800, the laser diode 808 illuminates the cell 804 and its light transits the cell 804 and is reflected by the mirror and focused back into the cell 804, passing through it again. The controller 848 controls the other components and, as with the controller 82, creates a self-oscillating circuit, using positive feedback derived from the signal received at the photodetector 824 to modulate the frequency of the laser diode 808. The controller 848 also uses the detected signal to provide a measurement, such as a magnetic vector measurement.

The magnetometer 800 of FIG. 8 pumps and probes using a single laser diode 808. Because it uses a single laser diode 808, the magnetometer 800 has reduced power requirements and a reduced number of components relative to the magnetometer 50 of FIG. 2.

Although portions of this description focus on the measurement of magnetic field strength and direction, other embodiments of the invention may provide a device that measures gravity or time. Additionally, the device may be used as a gyroscope or compass.

While the invention has been described with respect to certain embodiments, the description is intended to be exemplary, rather than limiting. Modifications and changes may be made within the scope of the appended claims.

What is claimed is:

1. A magnetometer, comprising:
   a spin ensemble with a Larmor resonance frequency, a Larmor resonance period, a first transition corresponding to optical absorption resonance at a first wavelength and a second transition corresponding to optical absorption resonance at a second wavelength;
   a first light source providing a first light at the first wavelength so as to drive the first transition within the spin ensemble, the first light source being configured to illuminate and optically pump the spin ensemble;
   a second light source providing a second light at the second wavelength so as to drive the second transition within the spin ensemble, the second light source being configured to illuminate and probe the spin ensemble; and a detector positioned to detect light from the second light source that is transmitted through the spin ensemble;

wherein the first light and the second light are polarized with an ellipticity of at least 0.3, and wherein the spin ensemble is contained in a closed container.

2. The magnetometer of claim 1, further comprising a controller that uses positive feedback from the detector to modulate the first wavelength of the first light source in order to maintain the spin ensemble in a resonant state.

3. The magnetometer of claim 1, further comprising polarizers that polarize the first light and the second light to increase the ellipticity of the first light and second light, respectively.

4. The magnetometer of claim 1, wherein the first and second lights have different polarizations.

5. The magnetometer of claim 1, wherein the first light source and the second light source comprise Vertical Cavity Surface Emitting Lasers (VCSELs).

6. The magnetometer of claim 1, wherein the spin ensemble comprises:

an alkali metal contained in the closed container having at least one optical path that is transparent to the first light and the second light; and optionally, a buffer gas.

7. The magnetometer of claim 6, wherein the alkali metal is cesium.

8. The magnetometer of claim 6, wherein the first and second transitions contribute to a major spectral line of the alkali metal.

9. The magnetometer of claim 1, wherein the container is made of an opaque material, except for the optical path.

10. A method of taking a quantum mechanical measurement, comprising:

illuminating a spin ensemble having a Larmor resonance frequency, a Larmor resonance period, a first transition corresponding to optical absorption resonance at a first wavelength and a second transition corresponding to optical absorption resonance at a second wavelength using a first light of the first wavelength selected to drive the first transition within the spin ensemble and a second light of the second wavelength selected to drive the second transition within the spin ensemble, the first and second lights being polarized with an ellipticity of at least 0.3; wherein the spin ensemble is contained in a closed container;

detecting a portion of the second light that is transmitted through the spin ensemble;

using the portion of the second light to make the quantum mechanical measurement; and using the result of said detecting to modulate the first wavelength of the first light around the Larmor frequency of the spin ensemble to maintain the spin ensemble in a resonant state.

11. The method of claim 10, wherein the quantum mechanical measurement is a measurement of the magnitude of a magnetic field.

12. The method of claim 11, wherein the first light is produced by a first diode laser and the second light is produced by a second diode laser.

13. The method of claim 12, wherein the first and second diode lasers are Vertical Cavity Surface-Emitting Lasers (VCSELs).

14. The method of claim 11, wherein the spin ensemble comprises:

an alkali metal contained in the closed container having at least one optical path that is transparent to the first light and the second light; and optionally, a buffer gas.

15. The method of claim 14, wherein the alkali metal is cesium.

16. The method of claim 14, wherein the first and second transitions contribute to a major spectral line of the alkali metal.

17. The method of claim 14, wherein the container is made of an opaque material, except for the optical path.

* * * * *